United States Patent [19]
Keiser et al.

[11] Patent Number: 5,736,867
[45] Date of Patent: Apr. 7, 1998

[54] METHOD AND CIRCUIT FOR RECONFIGURING A BUFFER

[75] Inventors: Fred W. Keiser, Eagan; Michael F. Maas, West St. Paul, both of Minn.

[73] Assignee: Cypress Semiconductor Corporation, San Jose, Calif.

[21] Appl. No.: 658,671

[22] Filed: Jun. 4, 1996

[51] Int. Cl.⁶ .................................................. H03K 19/0175
[52] U.S. Cl. ........................... 326/38; 326/21; 326/82
[58] Field of Search ............................ 326/21, 37, 38, 326/56, 82, 86

[56] References Cited

U.S. PATENT DOCUMENTS

| | | | |
|---|---|---|---|
| Re. 34,916 | 4/1995 | Sweeney | 326/21 X |
| 4,612,459 | 9/1986 | Pollachek | 326/38 X |
| 5,402,014 | 3/1995 | Ziklik et al. | 326/37 |
| 5,508,650 | 4/1996 | Grimm et al. | 327/416 X |

*Primary Examiner*—David R. Hudspeth
*Attorney, Agent, or Firm*—Oblon, Spivak, McClelland, Maier & Neustadt, P.C.

[57] ABSTRACT

A reconfigurable buffer circuit capable of producing an active high or an active low output signal in accordance with a stored control parameter that is input to the buffer circuit. The reconfigurable buffer circuit has an output buffer that outputs a buffered output signal corresponding to an input signal. The reconfigurable buffer control circuit also has a control circuit that receives and stores an inputted control parameter, and receives at least one control signal from a control signal source. Based on the stored control parameter and the at least one control signal received from the control signal source, the control circuit produces the input signal.

27 Claims, 7 Drawing Sheets

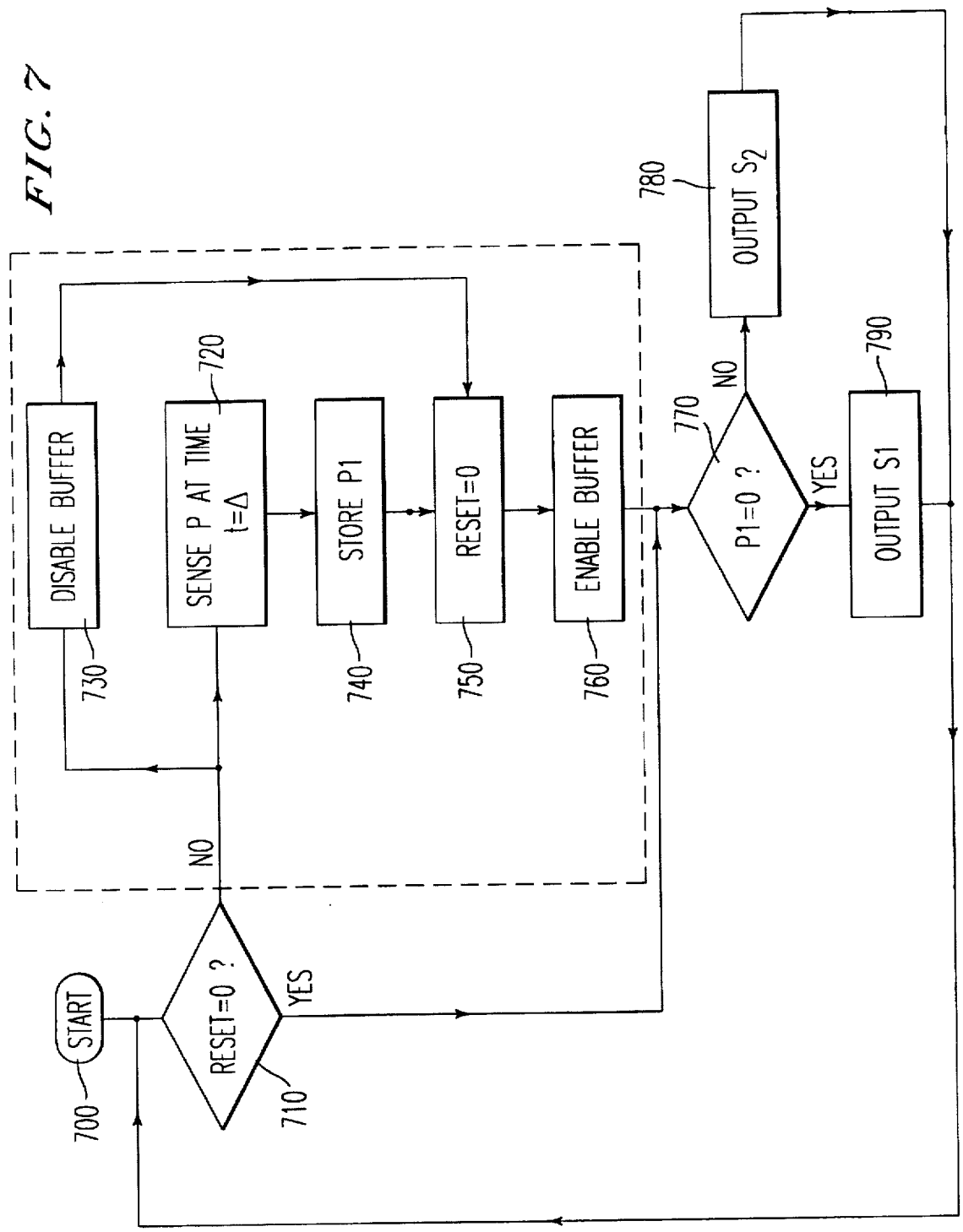

METHOD AND CIRCUIT FOR RECONFIGURING A BUFFER

BACKGROUND OF THE INVENTION

1. Field of the Invention

The present invention pertains to buffer amplifiers used in integrated circuits and more particularly to buffer amplifier control circuits that are reconfigurable and useful for controlling various circuits having different, but known, characteristics.

2. Discussion of Background

Typically, control circuits are designed to provide either active high output signals or active low output signals, but not both. Active high output signals control active high controlled circuits; and active low output signals control active low controlled circuits. An active high controlled circuit is one that operates in response to a logic high (i.e., a digital one), but does not operate in response to a logic low (i.e., a digital zero). An active low controlled circuit is one that operates in response to a logic low (i.e., digital zero) but does not operate in response to a logic high (i.e., digital one). Unless special measures are taken, a control circuit that outputs an active high output signal is incompatible with a controlled circuit that has been designed to be controlled by an active low control signal, and vice versa.

A typical approach to achieving compatibility when the control circuit and the controlled circuit are mismatched is to add extra circuitry to change the polarity of the control signal. FIGS. 1, 2 and 3 further illustrate this point. In FIG. 1, buffer circuit 20 provides a control signal through a buffer output 46 for controlling controlled circuit 16 (assumed to be an active high circuit). The signal output through buffer output 46 is initially generated in core logic 22, as shown in FIG. 2. Core logic 22 provides output signal S1 to output line 70 which is the input of buffer amplifier 50. If buffer amplifier 50 is enabled by enable signal E1, and E1 is applied to buffer enable line 80, output signal S1 is the buffered output signal provided at buffer output 46. The buffered output signal S1 is then used to control controlled circuit 16.

Suppose that controlled circuit 16 is an active low circuit, and thus requires a control signal having a complementary polarity to S1 (i.e., $\overline{S1}$, shown as the third signal in FIG. 2). A conventional solution has been to add an inverter circuit 95, as shown in FIG. 3, to each line (bus line, node, or otherwise) that is controlled by the control circuit. Once the inverter 95 is disposed between buffer circuit 20 and controlled circuit 16, the buffered output signal is inverted by inverter 95, and applied as the appropriate active low control signal for controlling circuit 16.

The conventional solution is suboptimal for several reasons. For example, if the design calls for a thirty-two bit bus, thirty-two inverters are needed in order to control each of the 32-bit bus lines. Clearly, this is undesirable because the inverters will occupy valuable board real estate that could be used for other purposes. The incompatibility problem is even more pronounced when tri-state buffers are used (such as the tri-state buffer circuit 20 shown in FIGS. 1 and 3). The tri-state buffers, however, may require additional logic components (e.g., additional enabling logic) interposed between enable line 80 and buffer 50 in order to enable and disable buffer 50 at appropriate times in order to be compatible with the controlled circuit 16.

Other problems exist with using a standard buffer control circuit to control various standard controlled circuits, especially in multiprocessor-based systems. One problem is controlling the directionality of the control pin (e.g., buffer output 46 of a chip 14). For example, if a plurality of microprocessor-based boards in a multiprocessor-based system communicate via a bus in a master/slave arrangement (e.g., in a VMEbus application), problems arise, such as in controlling the many external (i.e., off-board) bidirectional pins used for setting priorities and accessing various ports. Accordingly, in some cases the buffer output 46 may need to be configured as a receive-only pin. In these cases, an enable/disable signal must place the buffer in a high-impedance impedance state (i.e., a receive-only state) by applying a disable signal to the buffer enable line 80. However, in other cases the pin may need to be enabled. Additional enabling logic is required to convert the "disable" signal into an "enable" signal.

Another problem exists where the controlled circuit requires one of a set of different control signals. In this context, "different" means two or more control signals with distinct time-based waveforms that are not merely differing in polarity. For example, suppose core logic 22 generates a control signal S1 (see FIG. 2) for controlling a first controlled circuit 16. If the first controlled circuit 16 is then replaced with a second controlled circuit (not shown), and the second controlled circuit requires control signal S2 (see FIG. 2), a traditional buffer circuit cannot be reconfigured to replace control signal S1 with a second control signal S2. This creates the problem that control signal S1 produced by core logic 22 cannot be directly connected to output line 70, and additional switching circuitry (not shown) is required to provide signal S2 to the second controlled circuit.

The challenge for providing a common control circuit that is reconfigurable to change polarity, direction, and selection of control signals will become increasingly important as the number and diversity of third party products designed to support open system architecture bus structures grow. These third party products often include digital components made by various manufacturers and require a control or bus interface circuit (often included in a chip set) that is compatible with all of the components selected for a given board or set of boards. The VMEbus architecture is an example of an open system architecture where the bus provides a common resource for the exchange of data between the circuit boards that share the bus. Each VMEbus board that resides on the bus backplane has the burden of controlling its own various circuit devices (for both intra and inter-board communications), regardless of whether the various circuit devices are active high or active low, transmit or receive, etc. Thus, there is a growing need in multiprocessor applications to have a reconfigurable control circuit that, upon initialization, can adapt its characteristics in order to accommodate new controlled circuits. Aside from the VMEbus application, a reconfigurable control device would be greatly appreciated in single board computer systems as well as on boards used in at least the following other bus architectures: VXI bus; ISA bus; EISA bus; SCSI bus; IEEE 488 interface; SBus; Unibus; and an RS-232 interface.

The conventional solutions, such as adding inverters to correct the polarity of a control signal, have several deficiencies, including: requiring additional active components to be placed on the circuit board (e.g., a system board that may be part of a larger system employing multiple boards); consuming precious board space; interfering with thermal and power budgets of the board; and adding to board cost. These deficiencies are of critical importance in the marketplace where additional circuitry makes it difficult to produce low cost slave boards for master/slave architectures or in other applications requiring miniaturized, consumer-oriented as well as high-end electronics.

SUMMARY OF THE INVENTION

Accordingly, one object of this invention is to provide a novel method and apparatus that addresses the above-identified problems that stem from the use of standard controlled circuits requiring different control signals in microprocessor-based systems.

It is a further object of the present invention to provide a reconfigurable buffer circuit that includes an output buffer having a buffer signal input and an output, the output controlled by a control parameter and a control input applied thereto; an input device for inputting the control parameter; a control circuit having a first input for receiving the control parameter, a second input for receiving at least one control signal from a control signal source connected thereto, and a control circuit output connected to the buffer signal input, the control circuit including (1) a memory for storing the control parameter, and (2) an input signal source for inputting an input signal to the buffer signal input, based on the control parameter stored in the memory and the at least one control signal from the control signal source.

It is a further object of the present invention to provide a reconfigurable buffer circuit using a control parameter wherein the control parameter indicates a polarity of a control signal.

It is a further object of the present invention to control the data flow direction at a buffer output.

It is a further object of the present invention to use a control parameter for selecting a control signal from a set of possible non-complementary control signals used to control a controlled circuit.

It is a further object of the present invention to output a control parameter to a second circuit for the second circuit to generate a set of possible control signals based the control parameter.

It is a further object of the present invention to provide a reconfigurable tri-state buffer circuit.

It is a further object of the present invention to provide a reconfigurable buffer circuit having n input lines connected to n outputs of n corresponding circuits which connect to n circuits to be controlled, wherein each of the n input lines inputs a respective control parameter corresponding to one bit of an n-bit vector, and the n-bit vector corresponds to one of $2^n$ possible control signals output from the n outputs.

It is a further object of the present invention to provide a reconfigurable buffer circuit having n lines connected to n outputs of n corresponding tri-state buffers controlled by n corresponding enable lines, each of the n lines inputs a respective control parameter which corresponds to one bit of an n-bit vector, and the n-bit vector corresponds to one of $2^n$ possible enable signals output on the n enable lines connected to the n corresponding tri-state buffers.

It is a further object of the present invention to provide a reconfigurable buffer circuit having an active level detection circuit.

It is a further object of the present invention to provide a reconfigurable buffer circuit having an input for inputting a control parameter to the input line, including a resistor connected at one end to the input line and at its other end to a signal source $P_{in}$ providing an input signal indicative of the control parameter, and an input for receiving a reset signal for placing the reconfigurable buffer circuit in an initialization mode of operation.

It is a further object of the present invention to provide a reconfigurable buffer circuit having an input for inputting the control parameter at a predetermined time after the Reset signal is received by the means for receiving, whereby the signal reaches a stable value before being input.

The above-mentioned objects can also be achieved by providing a reconfigurable buffer method that includes the steps of (1) receiving at least one control signal from a control signal source, (2) receiving a control parameter, (3) producing an input signal in accordance with the control parameter and the control signal(s), and (4) applying the input signal to a buffer input of a buffer circuit to produce a buffered output signal.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 7 is an exemplary flowchart showing steps performed in an initialization mode of operation and an operational mode of operation.

DESCRIPTION OF THE PREFERRED EMBODIMENTS

Figure 1:
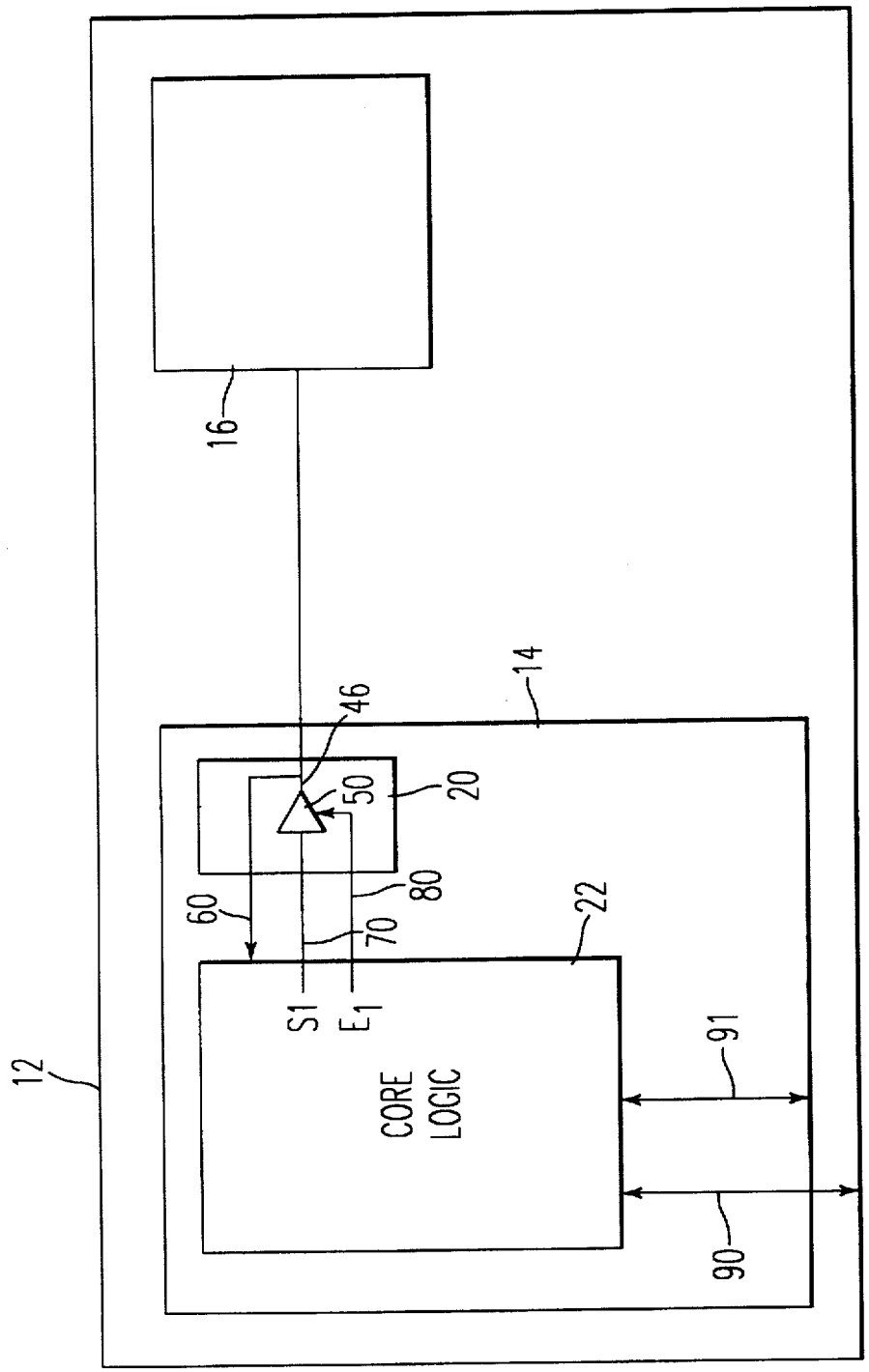
FIG. 1 is an exemplary schematic diagram of a circuit board including a buffer circuit and a controlled circuit.

Referring now to the drawings, wherein like reference numerals designate identical or corresponding parts throughout the several views, and more particularly to FIG. 4 thereof, a description the interconnection of components of the first embodiment is provided below and followed by a functional description. A circuit board 12 has a first chip 14 (e.g., a monolithic semiconductor device, a module or mezzanine board) that functions as a reconfigurable buffer circuit, a second chip 16 that is one of a variety of standard components to be controlled by first chip 14, and resistor 23. Chip 14 includes an input/output (I/O) buffer circuit 20, core logic 22, and active level detection circuit 18, which is shown in greater detail in FIG. 5.

Buffer circuit 20 includes buffer amplifier 50, buffer output 46, input line 60, output line 70 and buffer enabling line 80. Buffer 50 is called a "tri-state" buffer because it can output a "1", a "0", or a high impedance state (i.e., 1, 0, and high impedance constituting three states). The buffer amplifier 50 is preferably a tri-state amplifier as shown in FIG. 4, although a buffer amplifier without an enable line could be used as well. When an enable signal is applied to buffer enable line 80, signals input to the buffer amplifier 50 from output line 70 are buffered and output by buffer amplifier 50 on buffered output line 46. However, when buffer enable line 80 applies a disable signal to buffer amplifier 50, buffer amplifier 50 enters a high impedance state, and thus, operates as a receive-only node. Circuit 18 then receives information off of line 46 and via input line 60.

Buffer circuit 20 connects (e.g., via connectors, solder joints, wire connectors, backplanes, or busses) to a pin of standard component 16, which may be any of a variety of integrated circuit chips (e.g., Si, GaAs; Glue logic, ASIC, PALs, etc.) that accept a control signal. In a preferred embodiment of the present invention, i.e., a VMEbus board application, chips 14 and 16 are mounted on a VMEbus board 12.

Connected to line 46, and also active level detection circuit 18 through line 60, is an external resistor 23 which has applied thereto by a user a voltage $P_{in}$ during an initialization mode operation to input a control parameter through buffer circuit 20 to active level detection circuit 18. During this initialization, or programming step, a user applies a voltage $P_{in}$, being either a high or low voltage, to resistor 23 as a 1-bit control parameter to active level detection circuit 18. (A multi-bit control parameter could also be input to detection circuit 18 by applying, for example, a time-division multiplexed (TDM) voltage waveform having n bit intervals corresponding to an n-bit control parameter, to resistor 23. The input TDM voltage waveform is then stored as the n-bit control parameter in a shift register in the active level detection circuit 18, where the bit intervals of the TDM voltage waveform are synchronized with a shift rate of the shift register). A high voltage indicates the control parameter is a digital "1" and a low voltage indicates the control parameter is a digital "1". The value of the control parameter is known to the user and thus the user selects the appropriate voltage level to program (or reconfigure) circuit 18 in accordance with the selected control circuit 16. Preferably, the user will use the VMEbus P1 connector +5V and GND pins to program circuit 18. The +5V pin is used when a "1" control parameter is required and "GND" is used when a "1" control parameter is required. The control parameter is passed via input line 60 to active level detection circuit 18 which then stores the control parameter and makes it available to core logic 22 through connection 410.

Core logic circuit 22 is preferably a complementary metal oxide semiconductor (CMOS) standard cell circuit although a transistor-based logic circuit that includes active and/or passive components could be used, as well as other alternatives including an application specific integrated circuit (ASIC), a field programmable gate array (FPGA), a gate array, or a microcomputer and software based process. Core logic 22 not only communicates with circuit 18, but also communicates with other circuits within chip 14 through bidirectional connection 91 and communicates with off-chip components via off-chip bidirectional connection 90. Core logic 22 performs core functions of the control circuit, namely to produce, among other things, a first control signal passed through signal line SL1 and a second control signal through line SL2. Core logic 22 also generates a first enable signal E1 and a second enable signal E2 and provides E1 and E2 to active level detection circuit 18 through connections EL1 and EL2.

Based on the control parameter input through input line 60 and passed to core logic 22 through connection 410, core logic generates a first control signal S1 as well as a second signal S2. Alternatively, core logic 22 need not receive the control parameter in order to produce the candidate control signals S1, S2. Active level detection circuit 18 selects signal S1 and passes it through output line 70 for producing a buffered output signal made available on buffer output line 46. The buffered output signal is output when an enable signal E1, generated by core logic 22, is applied to buffer enable line 80 for enabling buffer circuit 20. Once enabled, the buffered output signal is applied to controlled circuit 16.

The reconfigurable buffer circuit (circuit 18 and circuit 20) operates in two modes of operation: an initialization mode and an operation mode. The initialization mode of operation begins when a reset pulse is input through connection 92 and applied to active level detection circuit 18. While it is shown that the reset pulse is received from an external source, the reset pulse could also be generated from a conventional timing circuit on core logic 22 or on active level detection circuit 18, or elsewhere on chip 14. For instance, the conventional timing circuit would generate the reset pulse having a predetermined pulse width in response to an assertion/(de)assertion edge of a SYSRESET signal provided by the VMEbus. The reset pulse could also be provided by a power-on-reset (POR) circuit that generates the reset pulse when power is first applied to the system in which the buffer circuit is employed.

Figure 2:
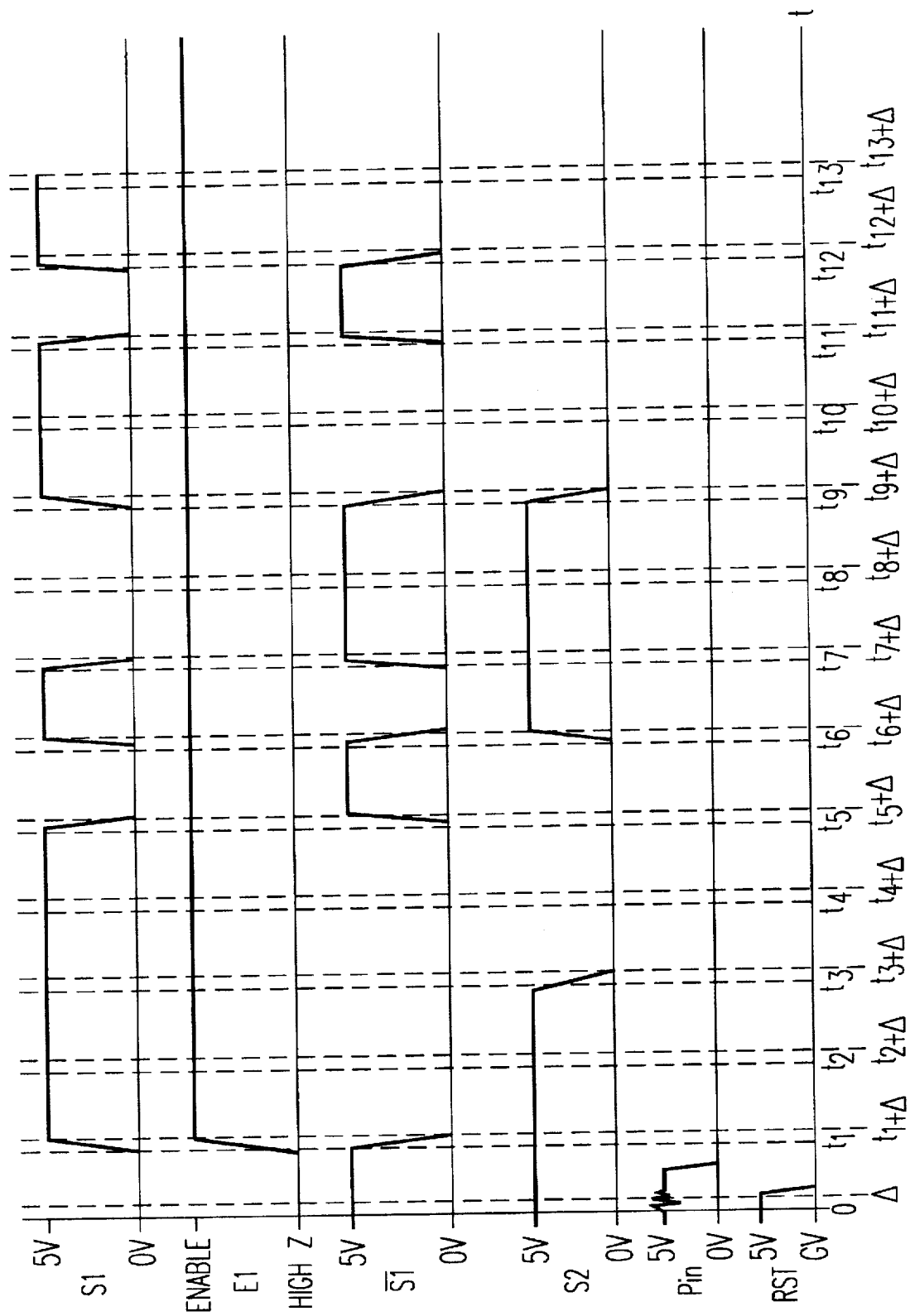
FIG. 2 is a timing diagram showing various control, enable and data signals used by a control circuit to control a controlled circuit.
Figure 3:
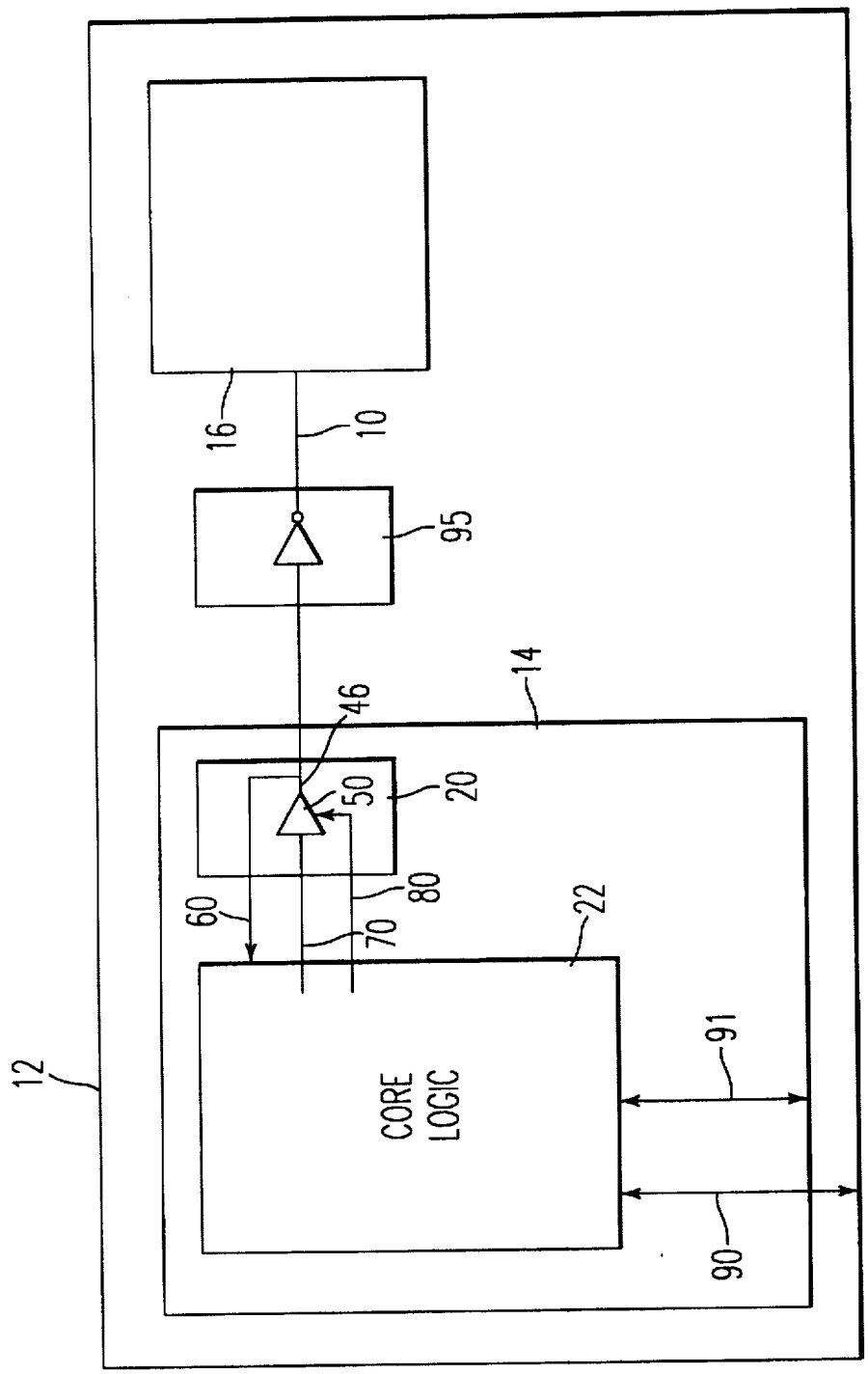
FIG. 3 is an exemplary schematic diagram of a circuit board including an inverter.
Figure 4:
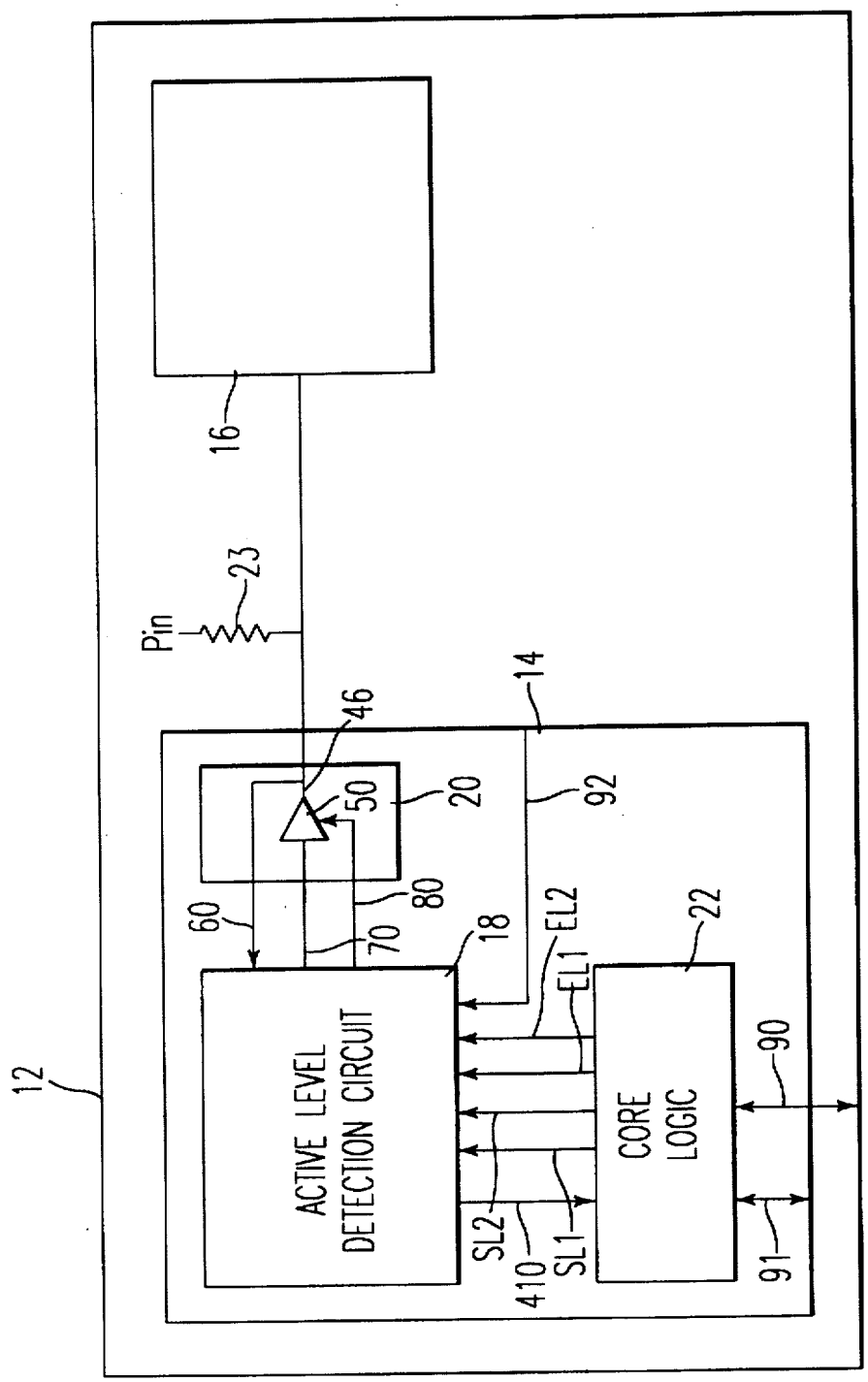
FIG. 4 is an exemplary schematic diagram of a first embodiment of the present invention.

With reference to FIG. 2 and FIG. 4, a description is made of the operation which occurs when the reset pulse is applied to connection 92 and active level detection circuit 18. When first applied, voltage source $P_{in}$ outputs a voltage indicative of the selected control parameter (in this case, a logic value "1" is represented by five volts, as shown in FIG. 2). Because the voltage applied to resistor 23 does not immediately settle, the reset pulse has a predetermined width, Δ, which provides ample time for the voltage on buffer output 46 to settle before being stored in active level detection circuit 18. During the initialization event, (i.e. when the reset pulse remains high) enable signal E1 disables buffer amplifier 50 such that buffer amplifier 50 is placed in a high impedance state, the control parameter is stored, the reset pulse transitions to logic low, voltage source $P_{in}$ is optionally removed from resistor 23 (although, preferably it is not removed), and at the next clock interval t1 (as shown in FIG. 2) buffer amplifier 50 is enabled and the buffer control circuit enters an operational mode of operation.

Figure 5:
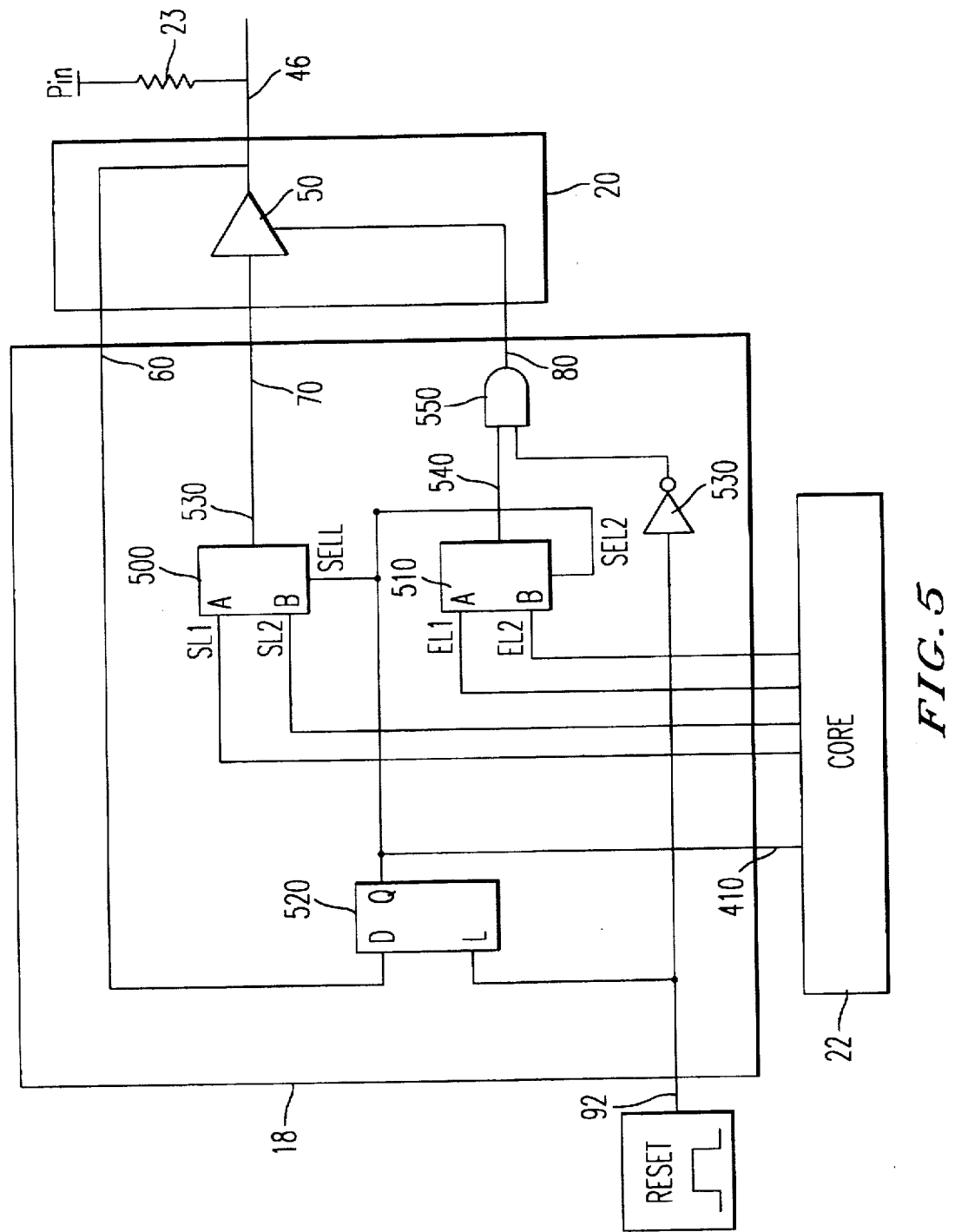
FIG. 5 is an exemplary diagram showing the interconnections of the reconfigurable buffer circuit of the first embodiment.

Before describing the operational mode of operation, FIG. 5 is used to describe in greater detail the preferred structure of active level detection circuit 18 and how it interconnects and operates with buffer circuit 20 and core logic 22. Active level detection circuit 18 includes data flip-flop 520 (or a shift register if a n-bit control parameter is input), which stores the control parameter that was input during initialization mode of operation. The control parameter is stored when a reset pulse input from connection 92 transitions from a logic high to a logic low, as shown in FIG. 2. Once this control parameter is latched into flip-flop 520, the stored control parameter is made available to other circuit components during the operational mode from output Q of flip-flop 520. In particular, the control parameter is provided through connection 410 to core logic 22 as well as select line 1, Sel1, for multiplexer 500 and select line 2, Sel2, for multiplexer 510.

Multiplexer 500 serves as a selection device for selecting between a first candidate control signal S1 provided from core logic 22 on SL1 and a second candidate control signal S2 provided from core logic 22 on SL2. Output Q of flip-flop 520 is applied to select line Sel1 for selecting the control signal having the appropriate polarity to output through multiplexer output 530 and ultimately to be used for controlling a controlled circuit 16 (shown in FIG. 4). Alternatively, active level detection circuit 18 can generate and select candidate control signals S1 and S2 having complementary polarities without receiving both signals S1 and S2 from core logic 22. For example, S2 can be derived from an input signal S1 by splitting a line that carries S1 and inverting one of the lines with an inverter. As a further alternative, by employing a two-input exclusive OR (XOR) gate (not shown), a polarity a first input signal S1 can be held constant or can be inverted by applying the control parameter to one of the XOR gate's inputs. Using this approach, two complementary signals need not be selected by active level detection circuit 18, but rather, a single input signal can be inverted (or not inverted) by the XOR gate and passed directly to the output line 70. For example, the control parameter having a logic level "1" is applied to the one of the XOR gate's inputs in order to change the polarity of S1, and a "1" is applied if no change in polarity is required.

Multiplexer 510 selects between two candidate enable signals, E1 and E2, provided from core logic 22 (serving as an enable control signal source) on EL1 and EL2 respectively. The selection is made by applying the stored parameter from output Q of data latch 520 to the multiplexer 510 enable input, Sel2. As shown in FIG. 2, enable signal E1 is at a logic high during the operational mode of operation. Accordingly, in this example buffer amplifier 50 is constantly enabled during the operational mode of operation.

Inverter 530 inverts the reset pulse from a logic high to a logic low, during an initialization mode of operation, in order to put buffer amplifier 50 in a high impedance state. By inverting the reset pulse, one of the two inputs to AND gate 550 is held at logic level low during initialization. Accordingly, a logic low is output from AND gate 550 in order to "disable" tri-state buffer amplifier 50. While buffer amplifier 50 is disabled, amplifier 50 is in a high impedance state which permits the control parameter to be input from resistor 23 during initialization.

When reset pulse transitions to a logic low state, active level detection circuit 18 changes from an initialization mode of operation to an operational mode of operation. The changeover is affected by inverter 530 outputting a logic level high, and thus, AND gate 550 then outputs a logic level low only when multiplexer 510 outputs a logic level low signal on line 540. Thus, during an operational mode of operation the enable signal selected by multiplexer 510 controls buffer enable line 80 and thus the state of buffer amplifier 50.

The width of the reset pulse input through connection 92 is a design parameter with a minimum value selected to correspond to a desired settle time for settling the voltage on buffer output 46 as applied from source $P_{in}$. When source $P_{in}$ applies a voltage across resistor 23, while the circuit is in initialization, the voltage on buffer output 46 will equilibrate over time and the predetermined period permits the voltage to settle, or dampen, to a stable signal level before flip-flop 520 actually latches the control parameter. The preferred predetermined period is pulse width Δ of 1 μs and is affected by the value of resistor 23 (preferably 10K ohms). However, the value of the resistor 23 and Δ are not restrictive values and much broader ranges could be used, (e.g., between 10 ohms and 1M ohms and 1 ns to 10 seconds).

Because the reconfigurable buffer circuit may be programmed by inputting control parameters, active level detection circuit 18 is capable of not only selecting between two complementary control signals (i.e., as described above), but also between two "different" control signals output from core logic 22. Suppose, for example, that the reconfigurable buffer circuit is to be used for controlling one of two possible control circuits where each of the two possible control circuits require a different control signal. In this case, core logic 22 generates a first control signal S1 applicable to a first controlled circuit, and a second control signal S2 applicable to a second controlled circuit. When controlling the first control circuit, a control parameter corresponding to control signal S1 is input through resistor 23 and stored during an initialization mode of operation in flip-flop 520. During an operational mode of operation, the stored control parameter is used to select control signal S1 using multiplexer 500 and for outputting the control signal as a buffered control signal. Similarly, when controlling the second control circuit, circuit 18 is reconfigured by storing a control parameter indicative of the second control circuit in flip-flop 520 during an initialization mode of operation and using the new control parameter to select control signal S2 for controlling the second control circuit.

Another aspect of the reconfigurable buffer circuit is that it may be used to dynamically control the directionality (or data flow direction) of buffer amplifier 50. In particular, multiplexer 510 may select between a first enable signal E1 and a second enable signal E2 for use in controlling the state of tri-state amplifier circuit 20. Suppose a first controlled circuit requires a specific time-based waveform E1 that requires buffer circuit 20 to be enabled and disabled at various times during the normal operation of the system. Core logic 22 generates the time-based enable signal E1 corresponding to the first controlled circuit as well as E2 which corresponds with the second controlled circuit. The control parameter stored in data latch 520 is then used to select enable signal E1, not E2, for controlling the first controlled circuit. While it is preferred for the control parameter input through resistor 23 to select between control signals S1 and S2 and enable signals E1 and E2, it would be clear to those skilled in the art that the control parameter could be used to select between only the control signals, or only the enable signals.

Figure 6:
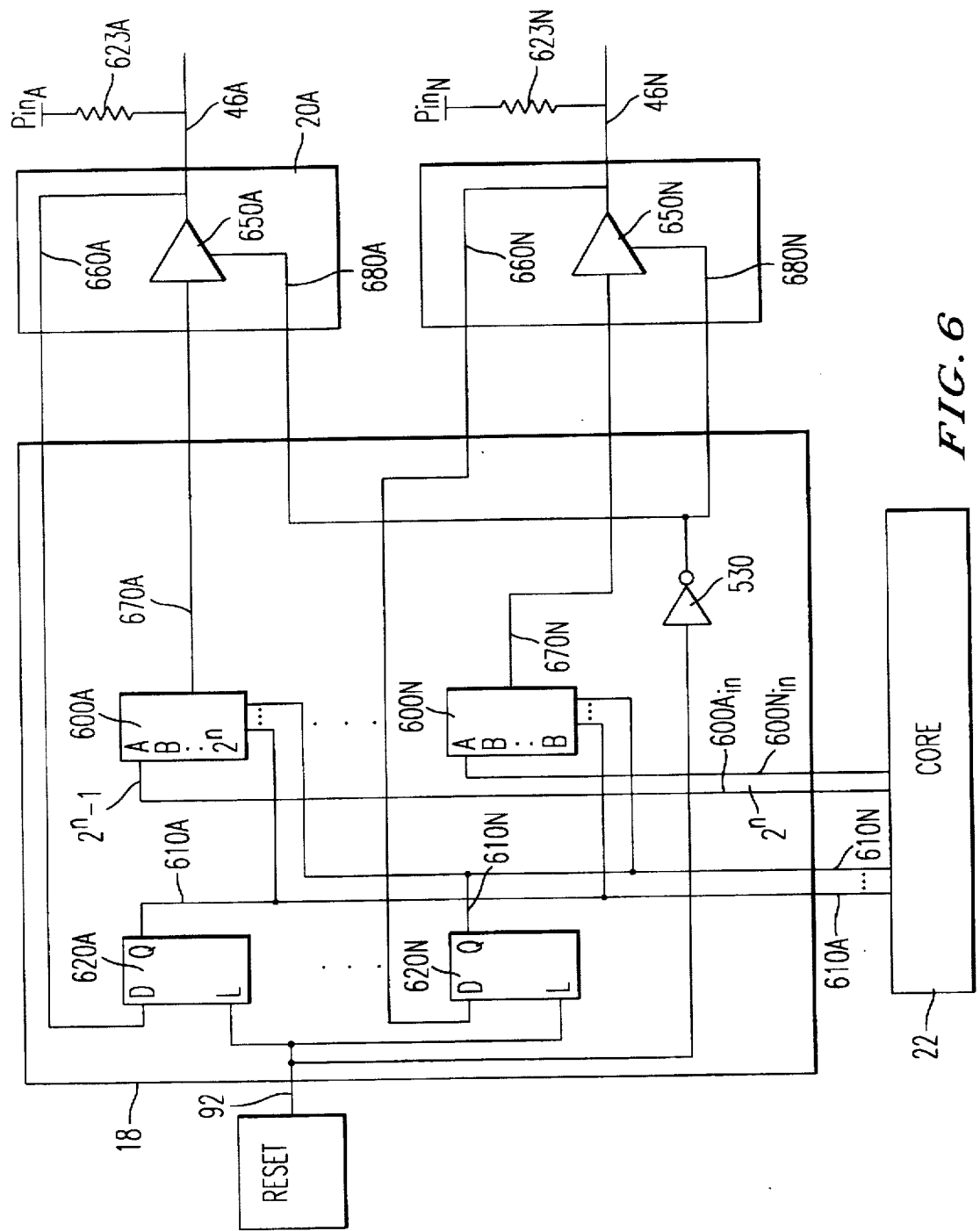
FIG. 6 is an exemplary diagram showing the interconnections of the second embodiment of the present invention.

FIG. 6 describes a second embodiment of a programmable, reconfigurable buffer circuit comprising an active level detection circuit 18, buffer circuits 20A–20N, and I/O lines 610A–610N and $600A_{in}$–$600N_{in}$ for connecting to core logic 22. The reconfigurable buffer circuit of the second embodiment receives an n-bit "vector input" from n sources $P_{inA}$ through $P_{inN}$ through corresponding resistors 623A–623N. $P_{inA}$ inputs a first bit of an n-bit vector through resistor 623A, and each of the other sources input, through corresponding resistors, second, third, . . . and an nth bit of the n-bit vector. The purpose of inputting a vector input is to provide a means for selecting between a large set of candidate control signals for controlling n different buffer circuits 20A–20N.

As an example, during an initialization mode of operation a first bit of a vector input is input through resistor 623A and buffer output 46A to the data input of flip-flop 620A. The first bit of the vector input is latched in flip-flop 620A when a reset pulse from an external reset means is applied through connection 92, which is also connected to latch input "L" of flip-flop 620A. Similarly the other n−1 bits of the n-bit vector are input to corresponding flip-flops 620b (not shown) through 620n. During this initialization mode of operation, the reset pulse applied from an external reset means through connection 92 is inverted by inverter 530 and applied through buffer enable lines 680A through 680N to disable respective buffer circuits 650A–650N.

During an operational mode of operation, the n-bit vector is output to core logic 23 through connections 610A–610N. Core logic 22 uses the n-bit vector to form a candidate set of $2^n$ control signals and provides the $2^n$ candidate control signals through connection $600A_n$ to multiplexer 600A (which is a $2^n$ by N multiplexer). One of the $2^n$ possible control signals is then selected by the n-bit vector which is input on the selection inputs (610A–610N) of multiplexer 600A. $2^n$ candidate control signals are applied respectively to each of the other n-1 multiplexers (i.e., 600b, not shown, to 600n), and a control signal is selected based on the stored n-bit vector. Although not shown in this particular embodiment it is clear that the enable line structure shown in the first embodiment could equally be expanded to accommodate the vector input. Furthermore, it should be clear that the n-bit vector need not be input to the core logic 22 in order to produce $2^n$ output signals.

FIG. 7 is an exemplary flow chart showing steps performed in an initialization mode of operation and an operational mode of operation for a one bit control parameter of the first embodiment (although it would also apply to the second embodiment where n=1). The boxes contained within the dashed area indicate the steps performed during the initialization mode of operation and the other steps (i.e., those steps outside of the dashed area) are performed during an operational mode of operation.

The process begins by determining in which mode of operation the circuit is operating. In step 710, it is determined whether a Reset signal (i.e., a reset pulse) is equal to logic level zero or not. If not, the reconfigurable buffer circuit enters the initialization mode of operation.

In the initialization mode of operation, the buffer circuit 50 is disabled (step 730), and the input signal $P_{in}$ is sensed (step 720), where the input signal is indicative of a control parameter. The sensing occurs at a time $t=\Delta$, which permits the input signal to have sufficient time to settle. Once sensed, in step 740 the input signal P1 is stored, the stored value being indicative of the input control parameter. In step 750, the reset signal is then set to a zero value, and the disable signal is then removed from the buffer circuit to enable the buffer (step 760).

Once the reset pulse is set to zero and the buffer has been enabled, the reconfigurable buffer circuit enters the operational mode of operation. It is first determined, in step 770, whether the stored input signal is equal to zero or not. If not, the buffer circuit outputs a signal S1 which is provided by an external source (i.e., core logic 22 as shown in the other figures). If, however, P1 equals zero, the reconfigurable buffer circuit outputs a control signal S1 (step 790). The reconfigurable buffer circuit continues to output either S2 or S1, depending on which control parameter is stored in the system, until such time as decision block 710 determines that Reset does not equal zero.

While this method has been described with respect to a single control parameter it is also clear that the control parameter could represent either polarity, or directionality, or a different control signal as applied by core logic. Furthermore the above described method is extendable to a vector input as was described in the second embodiment of this invention or is extendable to an n-bit control parameter.

The process set forth in FIG. 7, the function performed by core logic 22 (FIG. 4), and the function of active level detection circuit 18 (FIG. 4) may be implemented using a conventional general purpose digital computer programmed according to the teachings of the present specification, as will be apparent to those skilled in the relevant art(s). Appropriate software coding can readily be prepared by skilled programmers based on the teachings of the present disclosure, as will also be apparent to those skilled in the relevant art(s).

The present invention may also be implemented by the preparation of ASICs, FPGAs, or by interconnecting an appropriate network of conventional component circuits, as is described herein, modifications of which will be readily apparent to those skilled in the art(s).

The present invention thus also includes a computer product which may be a storage medium including instructions which can be used to program a computer to perform a process in accordance with the present invention. The storage medium can include, but is not limited to, any type of disk including floppy disk, optical disk, CD-ROMs, and magneto-optical disks, ROMs, RAMs, EPROMs, EEPROMs, Flash memory, magnetic or optical cards, or any type of media suitable for storing electronic instructions.

While particular embodiments of the present invention have been illustrated and described, it will be appreciated that numerous changes and modifications will occur to those skilled in the art, and it is intended that the appended claims cover all those changes and modifications which fall within the spirit and scope of the present invention.

Obviously numerous modifications and variations of the present invention are possible in light of the above teachings. It is therefore to be understood that within the scope of the appended claims, the invention may be practiced otherwise than specifically described herein.

What is claimed as new and desired to be secured by Letters Patent of the United States is:

1. A reconfigurable buffer circuit comprising:
   an output buffer comprising,
      means for receiving an input signal, and
      means for outputting a buffered output signal corresponding to said input signal;
      means for inputting a control parameter; and
   a control circuit comprising,
      means for receiving the control parameter input,
      means for receiving at least one control signal from a control signal source,
      means for storing said control parameter, and
      means for producing said input signal,
   wherein said buffered output signal is outputted in accordance with the stored control parameter and the at least one control signal.

2. The reconfigurable buffer circuit of claim 1, wherein said means for producing produces one of an active high signal and an active low signal having complementary polarities.

3. The reconfigurable buffer circuit of claim 1, wherein said means for producing produces one of a set of possible control signals having non-complementary polarities.

4. The reconfigurable buffer circuit of claim 1, further comprising the control signal source, which is capable of
   (a) receiving the control parameter from at least one of the control parameter inputting means and the control circuit,
   (b) providing the at least one control signal to the control circuit based on the control parameter.

5. The reconfigurable buffer circuit of claim 1, wherein said means for producing comprises a means for selecting the input signal from a plurality of control signals provided by said control signal source.

6. The reconfigurable buffer circuit of claim 1, wherein said control circuit further comprises the control signal source.

7. The reconfigurable buffer circuit of claim 6, wherein said control signal source is implemented in at least one of core logic and a microcomputer which performs a computer based process.

8. The reconfigurable buffer circuit of claim 1, comprising:

said means for inputting comprising a plurality (n) of input devices;

a plurality (n) of said output buffers, said control circuit receiving n control parameters from said plurality (n) of input devices corresponding to the plurality (n) of output buffers, each of the n control parameters corresponding to one bit of an n-bit vector; and said means for producing said input signal producing the input signal from $2^n$ possible control signals in accordance with said n-bit vector.

9. The reconfigurable buffer circuit of claim 1, further comprising said control signal source, wherein said control circuit and said control signal source reside on a common chip.

10. The reconfigurable buffer circuit of claim 1, wherein:

said control parameter inputting means comprises a resistor connected on one end to the means for receiving the input signal and to a signal source $P_{in}$ on its second end, said signal source $P_{in}$ providing the control parameter to said second end of said resistor.

11. The reconfigurable buffer circuit of claim 1, wherein:

said output buffer comprises a tri-state buffer having an enable input for controlling operation of the tri-state buffer in accordance with an enable input signal applied thereto; and said control circuit further comprises a means for producing the enable input signal from at least one of a set of enable signals provided by an enable signal source, said enable input signal controlling the tri-state buffer to perform a buffer function or to place said tri-state buffer in a high impedance state.

12. The reconfigurable buffer circuit of claim 11, wherein the control parameter is provided to the enable signal source, said enable signal source being capable of generating the set of enable signals in accordance with the control parameter.

13. The reconfigurable buffer circuit of claim 11, wherein said output buffer further comprises a buffer output, and said enable input signal is capable of controlling a data flow direction at said buffer output.

14. The reconfigurable buffer circuit of claim 11, wherein said control circuit further comprises the enable signal source.

15. The reconfigurable buffer circuit of claim 11, comprising:

said means for inputting a control parameter comprising a plurality (n) of input devices each inputting a respective control parameter;

a plurality (n) of said output buffers, said control circuit receiving n control parameters from said plurality (n) of input devices corresponding to the plurality (n) of output buffers, each of the n control parameters corresponding to one bit of an n-bit vector; and said means for producing said enable signal producing the enable input signal from $2^n$ possible enable signals in accordance with said n-bit vector.

16. The reconfigurable buffer circuit of claim 11, wherein:

said control parameter inputting means comprises a resistor connected on one end to the means for receiving the control parameter input and to a signal source $P_{in}$ on its second end, said signal source $P_{in}$ providing the control parameter to the second end of said resistor; and said control circuit further comprises means for controlling when the reconfigurable buffer circuit operates to store said control parameter in said storing means.

17. The reconfigurable buffer circuit of claim 16, wherein said control circuit further includes means for settling a signal produced by said signal source $P_{in}$ before storing said control parameter.

18. The reconfigurable buffer circuit of claim 16, further comprising a power-on-reset circuit for providing a reset signal to said means for controlling during the initialization mode.

19. A reconfigurable buffer circuit comprising:

a buffer, comprising,
a buffer input capable of receiving an input signal, and
a buffer output capable of outputting a buffered output signal;

an input device capable of inputting a control parameter signal; and a control circuit, comprising
a first control circuit input capable of receiving the control parameter signal from the input device,
a second control circuit input capable of receiving at least one control signal from a control signal source,
a memory capable of storing said control parameter signal, and
an input signal source capable of inputting said input signal to said buffer, said buffered output signal corresponding to said input signal in accordance with the stored control parameter signal and the at least one control signal received from said control signal source.

20. The reconfigurable buffer circuit of claim 19, wherein:

said buffer further comprises a tri-state buffer having a tri-state buffer enable input capable of
(a) receiving an enable input signal, and
(b) controlling operation of the tri-state buffer in accordance with said enable input signal;

said control circuit further comprises a third control circuit input capable of receiving at least one of a set of enable signals from an enable signal source; and an enable signal input source capable of producing the enable input signal in accordance with the stored control parameter signal and the set of enable signals from the enable signal source applied thereto, said enable input signal maintaining the tri-state buffer in a buffer state during a first operational mode and in a high impedance state during initialization.

21. The reconfigurable buffer circuit of claim 20, wherein said enable input signal places said tri-state buffer in a high impedance state in a second operational mode of operation to control a data flow direction at said buffer output.

22. The reconfigurable buffer circuit of claim 20, wherein:

said input device comprises a resistor connected on one end to the first control circuit input and to a signal source $P_{in}$ on its second end, said signal source $P_{in}$ providing said control parameter signal to said second end of said resistor;

said enable signal input source comprises a reset input for receiving a reset signal, said enable signal input source being capable of producing the enable input signal in accordance with the reset signal; and said input device is capable of inputting said control parameter signal when said enable input signal places the tri-state buffer in the high impedance state during initialization.

23. A method for operating a buffer circuit, comprising the steps of:

receiving from a control signal source at least one control signal;

receiving a control parameter;

producing an input signal in accordance with the control parameter and the at least one control signal, and applying the input signal to a buffer input of said buffer circuit to control an output of said buffer circuit.

24. The method of claim 23, wherein the applying step comprises:

applying said input signal to a buffer signal input to produce at a buffer output a buffered output signal based on said control parameter and said control signal.

25. The method of claim 23, wherein said step of receiving from a control signal source comprises receiving a plurality of said control signals, and said step of producing said input signal step comprises selecting the input signal from the control signals.

26. The method of claim 23, wherein the buffer circuit comprises at least one tri-state buffer having an enable input, and said method further comprises the steps of:

applying said input signal to the enable input of the buffer circuit, said input signal controlling the buffer circuit to perform a buffer function or to place the buffer circuit in a high impedance output state.

27. The method of claim 26, further comprising the sequential steps of:

inputting a reset signal to said buffer circuit to define an initialization mode of operation; and storing said control parameter a predetermined amount of time ($\Delta$) after inputting said reset signal.

* * * * *